United States Patent [19]

Kung et al.

[11] 4,449,207

[45] May 15, 1984

[54] BYTE-WIDE DYNAMIC RAM WITH MULTIPLEXED INTERNAL BUSES

[75] Inventors: Roger I. Kung; Stephen T. Flannagan; Jonathan N. Spitz, all of Beaverton; Perry H. Pelley, III, Aloha; Robert S. Riley, Gaston; Douglas J. Covert, Aloha, all of Oreg.

[73] Assignee: Intel Corporation, Santa Clara, Calif.

[21] Appl. No.: 373,218

[22] Filed: Apr. 29, 1982

[51] Int. Cl.³ .............................................. G11C 13/00
[52] U.S. Cl. .................................... 365/230; 365/189; 365/233
[58] Field of Search .............. 365/189, 191, 192, 230, 365/233

[56] References Cited

U.S. PATENT DOCUMENTS 3,402,398  9/1968  Koerner et al. ..................... 365/230

Primary Examiner—Terrell W. Fears
Attorney, Agent, or Firm—Blakely, Sokoloff, Taylor & Zafman

[57] ABSTRACT

An MOS dynamic RAM organized in a byte-wide arrangement is described. An internal bus is used for multiplexed column address signals and data. Other multiplexing reduced the lines associated with the input/output circuits. A unique power-on circuit automatically resets clock generators if they are not operative after power is applied.

15 Claims, 10 Drawing Figures

W1 CLOCK

BYTE-WIDE DYNAMIC RAM WITH MULTIPLEXED INTERNAL BUSES

BACKGROUND OF THE INVENTION

1. Field of the Invention

The invention relates to the field of metal-oxide-semiconductor dynamic random-access memories (RAMs).

2. Prior Art

Dynamic random-access memories (RAMs) fabricated with metal-oxide-semiconductor (MOS) technology are well-known. Most often the cells of these memories consist of a single active device (a field-effect transistor) and a capacitor for storing charge. Examples of such memories are described in U.S. Pat. Nos. 3,858,185; 4,038,646; and 4,247,917.

In many MOS RAMs, a single location in memory is accessed for each address applied to memory. That is, the memory "chip" is organized, for instance, as a 64K×1 memory. More recently, MOS RAMs are fabricated where 8 locations in memory are accessed for each address to provide special compatibility with 8-bit buses. These memories present unique design problems in that more lines are required on the chip to carry the input and output data. Often these lines are metal lines, requiring considerable area. Consequently, unique designs are required if substrate area is to be held to a minimum.

Applicant has filed another application covering a byte wide dynamic RAM entitled "BYTE WIDE DYNAMIC RAM", Ser. No. 192,740, filed Oct. 1, 1980 and assigned to the assignee of the present application.

SUMMARY OF THE INVENTION

A random-access memory disposed on a substrate is described. The memory includes at least two spaced-apart groups of memory cells, with a bus disposed between the spaced-apart cells. Column decoders decode column address signals such that sense amplifiers ("amps") in the groups of cells are selected. These column decoders are disposed between the spaced-apart cells, beneath the bus. Input/output ("I/O") lines are coupled to the cells by the bus for communicating data to the cells; these lines extend toward the bus from write and "help" sense amps. Multiplexing means allowing the bus to first carry address signals to the decoders and then to couple data through the I/O lines to the bit lines and memory cells. The bus is used for both address signals and data signals, eliminating the need for an additional bus and thereby reducing the substrate area required for the memory.

The memory also includes multiplexed data lines from the "help" sense amplifiers and the write amplifiers to the input and output buffers.

The memory features other improvements such as an automatic power-up reset circuit which automatically resets the timing generators in the event that one or more of the generators fail to operate properly when the circuit is powered-up.

DETAILED DESCRIPTION OF THE INVENTION

A random-access memory (RAM) is described. In the following description, numerous specific details are set forth including specific timing diagrams, number of bits, etc., in order to provide a thorough understanding of the present invention. However, it will be obvious to one skilled in the art that the present invention may be practiced without these specific details. In other instances, well-known circuits and processes are not described in detail in order not to obscure the present invention in unnecessary detail. Other aspects of the described memory are set forth in a copending application entitled "TESTING METHOD AND APPARATUS FOR DRAM", Ser. No. 374,622, filed May 3, 1982 and assigned to the assignee of the present application.

In its presently preferred embodiment, the RAM is realized employing well-known metal-oxide-semiconductor (MOS) technology. More specifically, a double polycrystalline silicon (polysilicon) process is used which provides enhancement mode transistors, depletion mode transistors and transistors having a threshold voltage of approximately 0 volts. The n-channel transistors employed in the memory operate from a single 5 volt supply ($V_{CC}$). The memory arrays are formed with a conventional one transistor cell, polysilicon word lines, folded metal bit lines and a full capacitance dummy cell. The dummy reference voltage is regenerated after each cycle by a charge-sharing circuit. An active restore circuit boosts the bit lines back to a full $V_{CC}$ level after a read or refresh cycle. Boosted word lines and column select lines are used to write a full $V_{CC}$ level into the memory cells.

The dynamic RAM in its presently preferred embodiment, is organized as an 8K×8 memory. Thus, for each unique 13 bit address signal, an 8-bit location may be is accessed. The described RAM is formed on a single substrate and packaged in a 28 pin DIP (dual-inline-pin) package. The address signals are not multiplexed, but the input and output data signals are. The pin connections in addition to $V_{CC}$, data and address, include RDY (ready), $V_{SS}$ (ground), WE/ (write enable bar), OE/ (output enable bar) and CE/ (chip enable bar).

In fabricating a byte-wide of wider memory simultaneous access to a plurality of locations in the array or arrays is necessary. Numerous data lines are required to carry the data to and from these locations. With current practices, these lines must have low resistance and capacitance since the level of signals being carried on them is quite low. Often these lines are fabricated from metal such as aluminum and are relatively wide. For example, it is not uncommon for these lines to have a pitch of 9 microns with current MOS production processing.

GENERAL BASIC ARCHITECTURE

Figure 1:
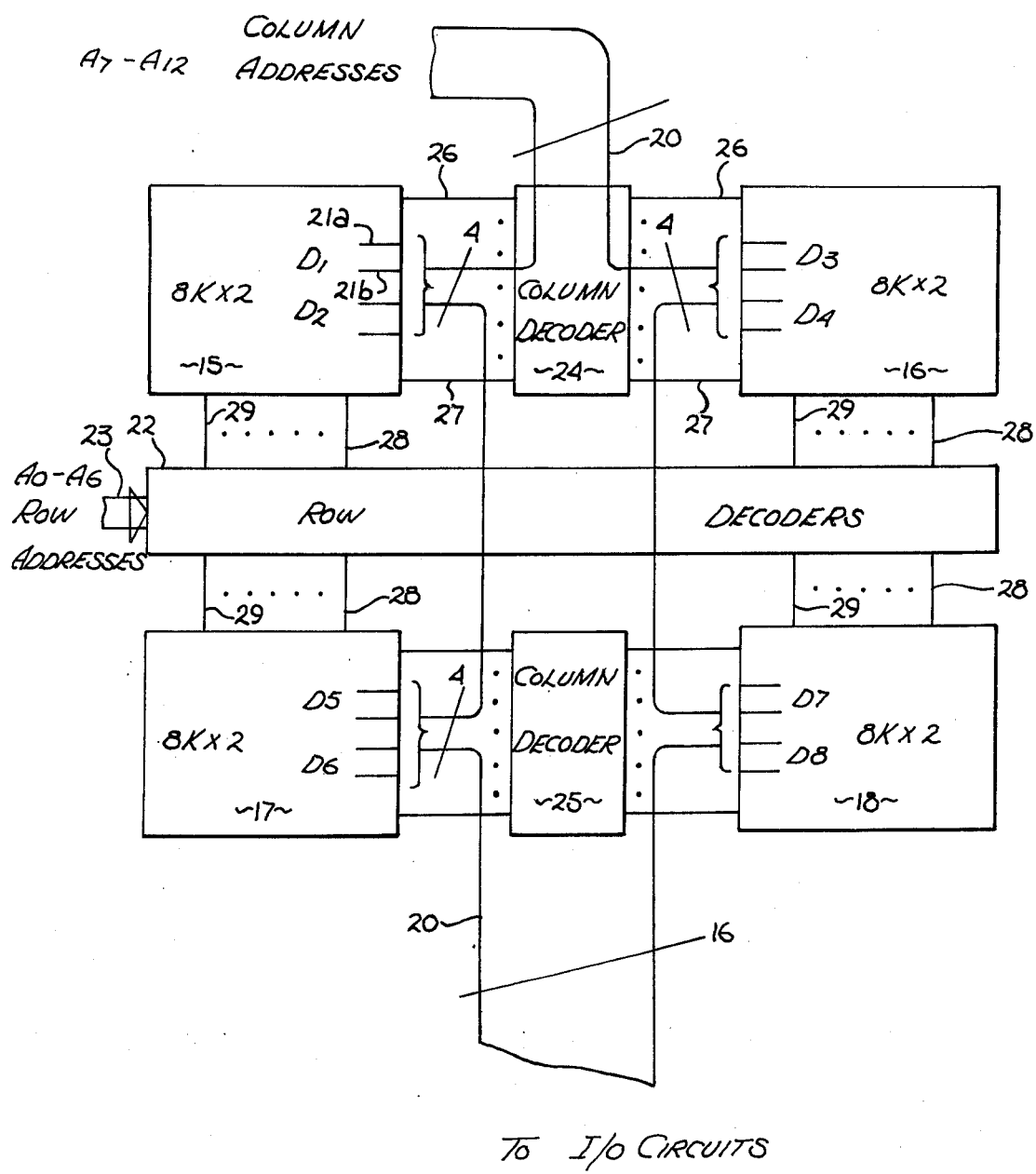
FIG. 1 is a block diagram illustrating the general architecture of the memory with its multiplexed bus disposed between memory cell arrays.

Referring now to FIG. 1, a central bus 20 is disposed between the memory arrays for carrying both the column address signals and the input/output data signals. The bus 20 is comprised of 16 lines which communicate with the input/output data circuits and additionally carry the column address signals $A_7$ through $A_{12}$ (and their complements) to the column decoders 24 and 25. The memory is organized into four 8K×2 arrays (quadrants) 15, 16, 17 and 18. These arrays are spaced-apart, allowing the bus 20 to pass therebetween. Multiplexing means which will be described in conjunction with FIG. 2, permit the bus 20 to carry first the address signals to the column decoders 24 and 25 and then the input/output data. The column decoders select bit lines in the array-quadrants through lines such as lines 26 and 27. For each unique column address ($A_7$–$A_{12}$) two locations in each quadrant are accessed. This is shown, for instance, in the array-quadrant 15 as $D_1$ and $D_2$, array-quadrant 16 as $D_3$ and $D_4$, etc. As is typically the case with dynamic RAMs, the data bit and its complement are read into and from the split bit lines. For $D_1$, lines 21a and 21b are used; two lines are illustrated for each of data bits $D_2$–$D_8$. Consequently, four data lines interconnect each of the array quadrants with the bus 20.

The row decoders 22 are disposed generally perpendicular to the bus 20 between the array-quadrants 15 and 17, and array-quadrants 16 and 18. These decoders receive the true and complementary address signals $A_0$ through $A_6$ and provide decoded signals on word lines such as lines 28 and 29. For each unique row address, a normal word line and a dummy word line are selected in each of the four quadrants.

The advantage to multiplexing the column addresses and the input/output data lines can be readily understood from FIG. 1. Without multiplexing, sixteen input/output data lines and twelve column address lines would be required. Assuming a pitch of 9 microns per line, an additional 108 microns in width would be required in the region of the arrays without the multiplexing. This would significantly add to the substrate area required for the memory and consequently reduce yields.

INTERNAL ADDRESS/DATA MULTIPLEXING

Figure 2:
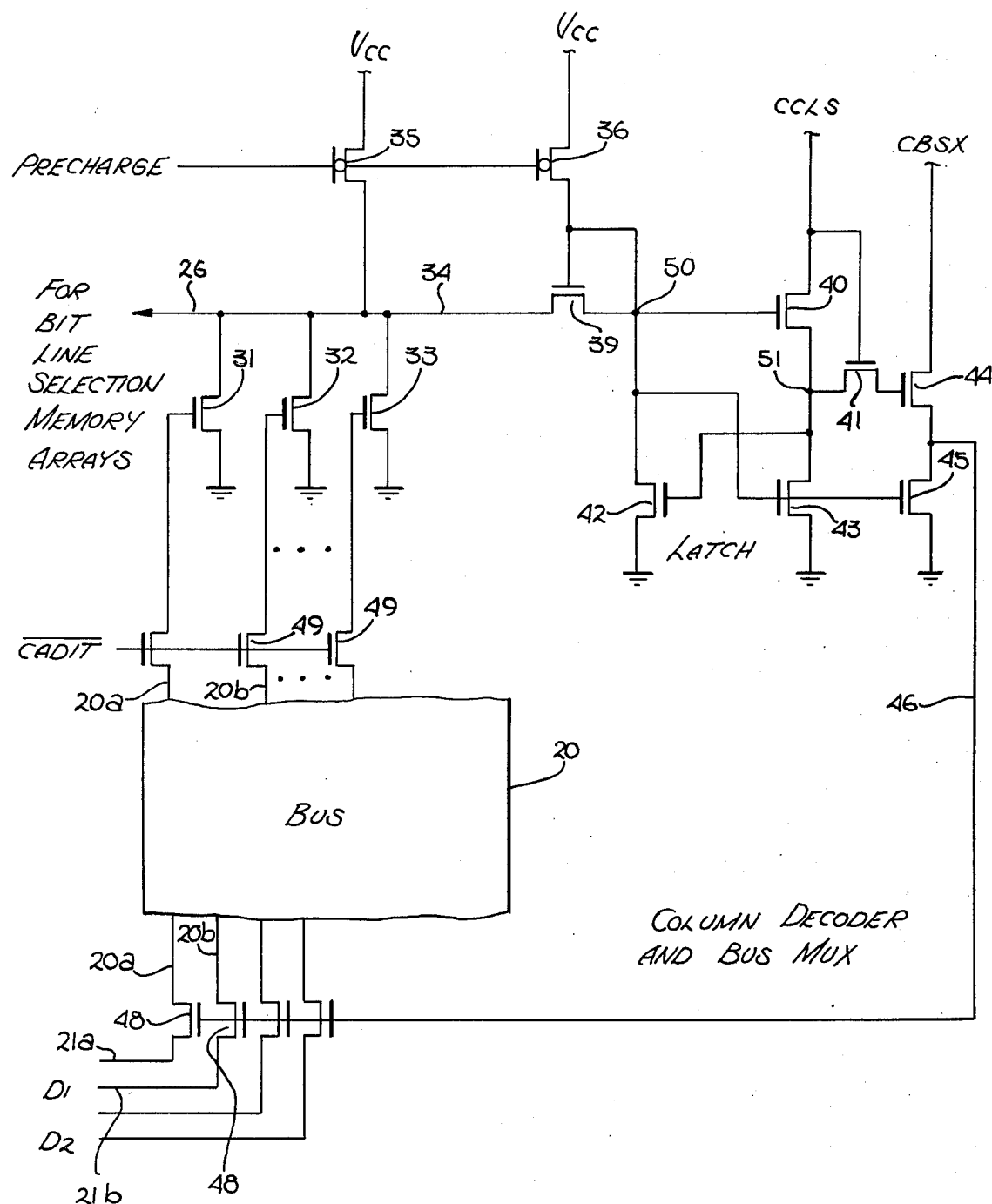
FIG. 2 is an electrical schematic illustrating the circuitry used to multiplex the column address signals and the I/O signals on the bus of FIG. 1.
Figure 10:
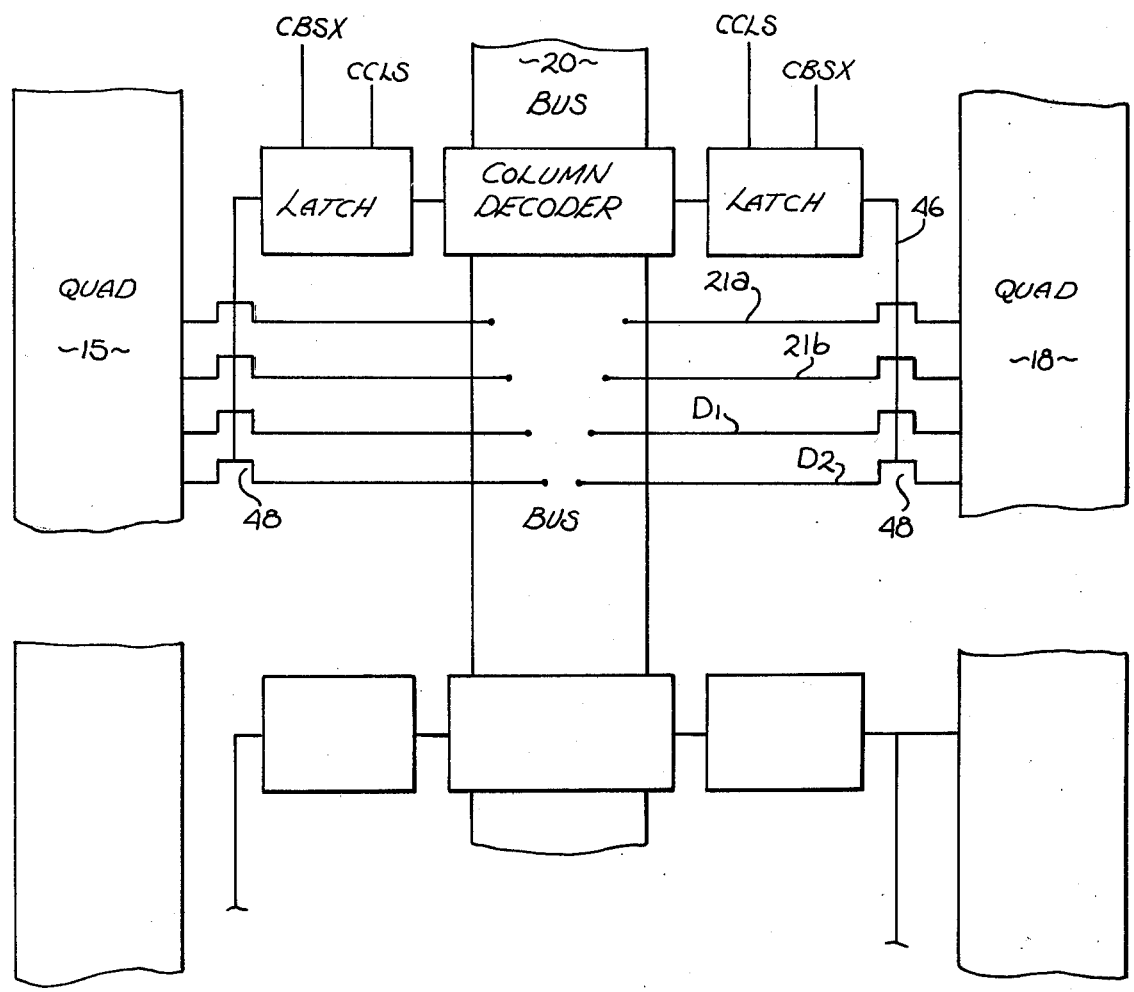
FIG. 10 is a block diagram illustrating the general architecture of the column I/O multiplex circuitry shown in FIG. 2.

Referring to FIG. 2, the multiplexing circuitry in addition to a column decoder is illustrated. The bus 20 is coupled to the decoder through transistors 49. The other decoders are likewise coupled to bus 20 with like transistors. When the CADIT/ signal is high all the column decoders receive the column address signals. Bit lines 21a and 21b are coupled to bus lines 20a and 20b when transistors 48 conduct. The other data bits $D_2$–$D_8$ are likewise coupled to the bus via like transistors 48. In the presently preferred embodiment, four of these other transistors 48 are controlled by another latch on this decoder via another line (See FIG. 10) like 46, and the other eight transistors like 48 are similarly controlled by a duplicate two latch column decoder between the other two quadrants. Thus, each decoder has one latch for each of the two memory quadrants which brings in 2 bits (the other latch not being shown in FIG. 2 for simplicity. See FIG. 10 for a block representation of the latch orientations).

Referring first to the column decoder of FIG. 2, it includes a plurality of transistors 31, 32, 33 and like transistors each of which receive one of the address signals $A_7$ through $A_{12}$ and their complements. The address signals are communicated from the bus 20 such as on lines 20a and 20b through the transistors 49 to the gates of the transistors 31 and 32, respectively and like transistors. These transistors are coupled between node 34 and ground. Node 34 is part of line 26 (FIG. 1) which line is used to select 2 sense amps in each of the array-quadrants. Node 34 is precharged to $V_{CC}$ through the zero threshold transistor 35. This node is charged by a precharging signal coupled to the gate of transistor 35 and also to the gate of the zero threshold transistor 36.

Node 34 is coupled to node 50 through the isolation transistor 39. Node 50 is common with the gate of the transistor 40 and one node of a latch (cross-coupled transistors 42 and 43 as well as the gate of the isolation transistor 39). The drain terminal of transistor 43 (node 51) is coupled through transistor 41 to the gate of pass transistor 44. Line 46 is coupled between the transistors 44 and 45; the gate of transistor 45 is coupled to node 50.

Figure 3:
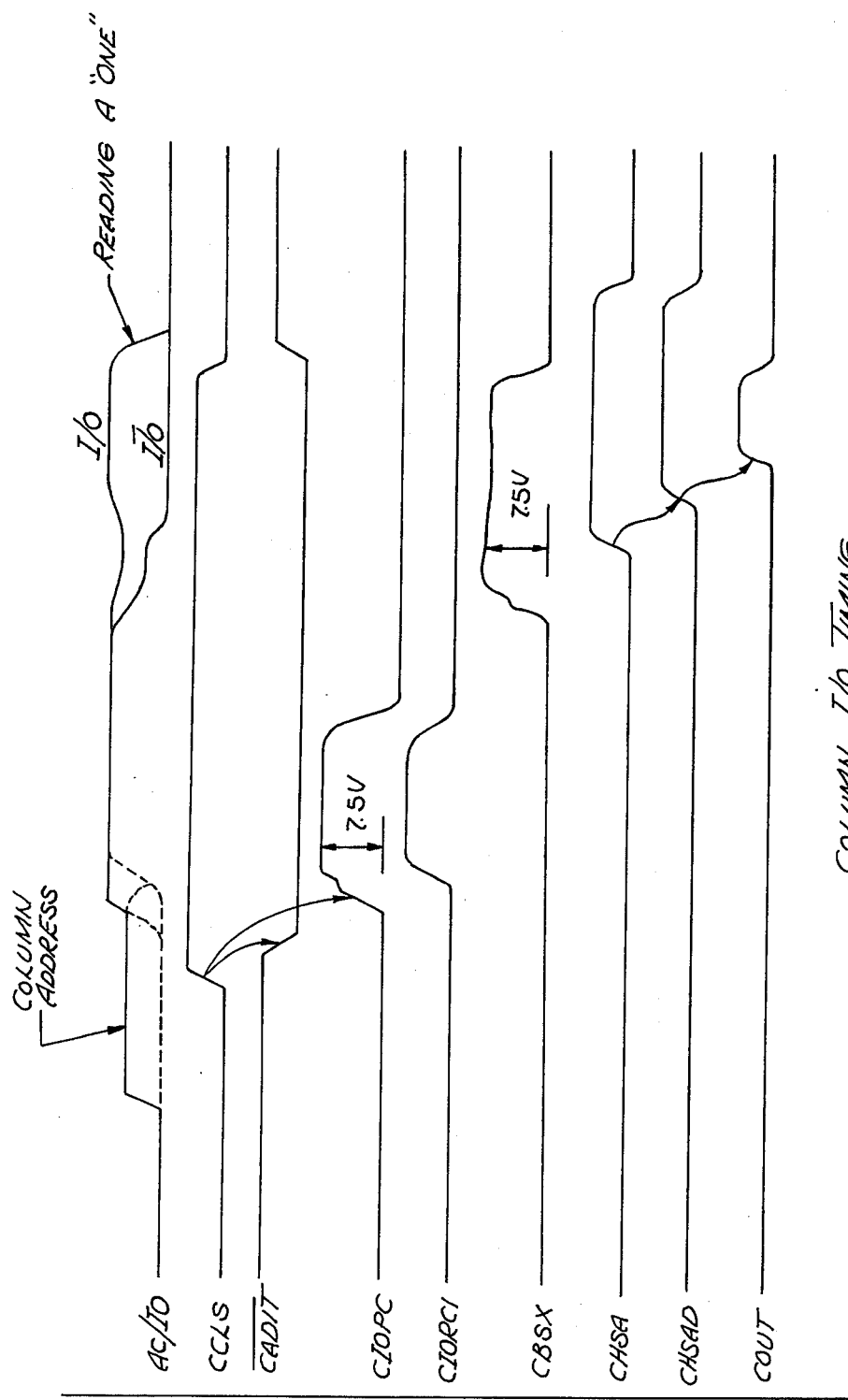
FIG. 3 is a graph of a plurality of waveforms showing the timing of various signals used in the memory.

When the address signals are being received by the memory, the CADIT/ signal is high as shown in FIG. 3. With this signal high, the address signals are coupled through lines 20a and 20b and like lines to the gates of transistors 31 and 32, respectively and like transistors. If all of the address signals are low, a high signal is present on line 26 since node 34 had been previously charged. If any one of these signals is high, then node 34 is coupled to ground in a usual manner.

Node 50 is precharged through transistor 36. Since transistor 39 conducts, the charge between nodes 34 and 50 is initially equal. The charge on node 50 causes transistors 43 and 45 to conduct. Since transistor 45 is conducting, line 46 is clamped and transistors 48 do not conduct. This assures that bus 20 is coupled only to the decoders and not to the sense amps. At this point in time if the address received by the decoders selected line 26, node 50 remains charged, otherwise node 50 is discharged through transistor 39. Shortly before the CADIT/ signal drops, the CCLS signal rises in potential as shown in FIG. 3. If node 50 is high, transistor 40 conducts and node 51 is pulled up with CCLS causing transistor 42 to conduct. This discharges node 50 and leaves the latch with node 51 high. Note when node 50 is discharged, transistor 39 no longer conducts, isolating node 34 from node 50. Now the I/O precharge clock, CIOPC, pulses momentarily up to 7.5 volts leaving the bus 20 precharged (the column address drivers having been shut off by a clock signal before CCLS) to $V_{CC}$. After this, the CBSX signal rises in potential (to 7.5 volts). This brings lines 46 up to this potential. This high potential on line 46 causes transistors 48 to conduct (without a threshold drop) and thus couples the sense amps to the bus 20. If line 26 had not been selected, node 50 would have been discharged before CCLS went high. Node 51 would remain low and transistor 44 would not conduct. This would prevent the selection of line 46.

Thus, for each column address signal, two sense amps in each array-quadrant are selected (by line 26 or equivalent lines) and the selected bit lines are coupled to the bus 20 by the signal on line 46 (or equivalent lines).

DATA IN/DATA OUT BUS MULTIPLEXING

Figure 4:
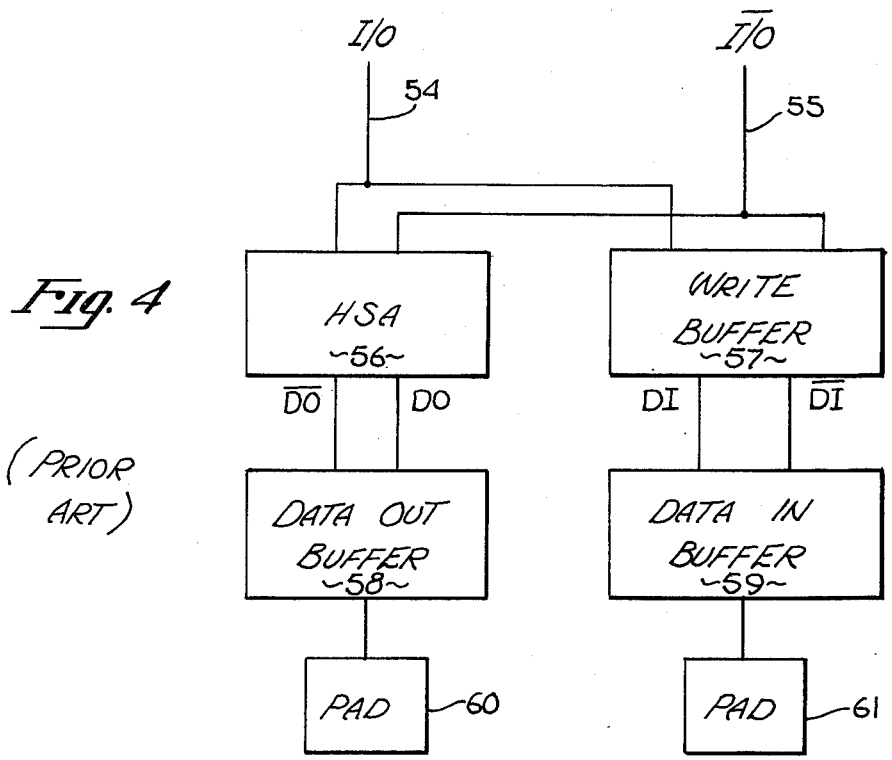
FIG. 4 is a block diagram of a prior art arrangement of amplifiers and buffers for coupling data between an internal input/output bus and terminals of the memory.

In prior art dynamic RAMs it is not uncommon to have separate terminals for the incoming data and outgoing data. This arrangement is shown in FIG. 4 with pad 60 being a data-out pad and pad 61 a data-in pad. The pad 60 is coupled to a data-out buffer 58 while the pad 61 is coupled to a data-in buffer 59. In dynamic RAMs, often the input and output data is internally multiplexed on a common bus and the data signal and its complement are transmitted over the bus such as indicated by lines 54 and 55. Line 55 is coupled to both a help sense amplifier (HSA) 56 and to a write buffer 57. Line 54 is similarly coupled to both the sense amplifier 56 and the write buffer 57. The data-out signal and its complement are coupled from the sense amplifier 56 to the data-out buffer, and similarly, the data-in signal and its complement are coupled from the data-in buffer 59 to the write buffer 57. When data is received on pad 61, the data is buffered and its complement generated within buffer 59 and the data is communicated to the buffer 57. The data is then written into the memory via lines 54 and 55. When data is read from memory, it is coupled from a cross-coupled sense amplifier disposed between bit lines halves onto the lines 54 and 55, then to the help sense amplifier 56. The data is there amplified and communicated to the output pad 60 via buffer 58.

The prior art arrangement of FIG. 4 is not used in the present invention, since among other reasons input and output data are mutliplexed onto a single pad. More importantly, it should be noted that in the arrangement of FIG. 4, four lines interconnect the help sense amplifier 56 and buffer 57 with the buffers 58 and 59. Where the memory is a byte wide memory such as the presently preferred embodiment, 8 sets of buffers 58 and 59 are required, and hence, 32 lines would be needed between these buffers and the help sense amplifiers and write buffers. As will be seen with the architecture used in the present invention, the number of lines coupled to the output and input buffer is reduced, thereby reducing the amount of substrate area required for the memory.

Figure 5:
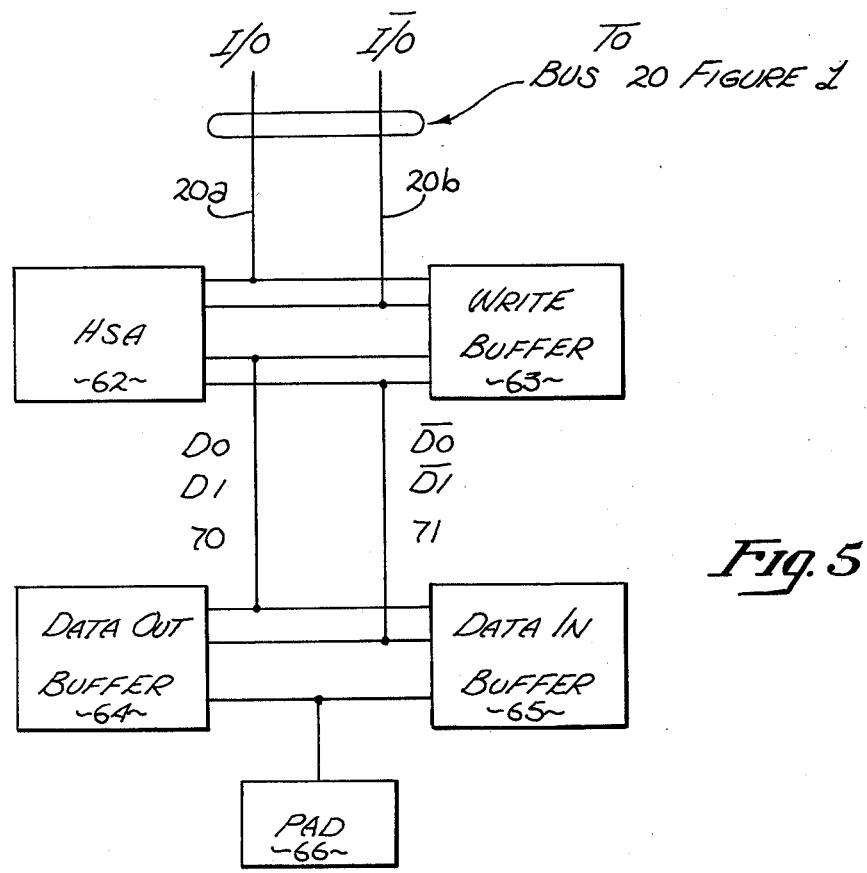
FIG. 5 is a block diagram illustrating the layout of the help sense amplifier, write buffer and data-in and data-out buffers used in the invented memory.

Referring to FIG. 5, in the presently preferred embodiment, as mentioned, a single pad is used for both the input data and output data, such as pad 66. Eight such pads are used since data is read into and out of the memory in bytes. Pad 66 is coupled to both the data-out buffer 64 and the data-in buffer 65. These buffers are coupled to the help sense amplifier 62 and write buffer 63 through a single pair of lines 70 and 71. HSA 62 and buffer 63 are coupled to the I/O lines of the bus 20 such as the lines 20a and 20b.

With the architecture of FIG. 5, during the reading of data only HSA 62 and data-out buffer 64 are required. The buffers 63 and 65 are effectively disabled during reading. Similarly, during writing only the buffers 65 and 63 are required. The help sense amplifier 62 and buffer 64 are disabled during writing of data into memory.

Figure 6:
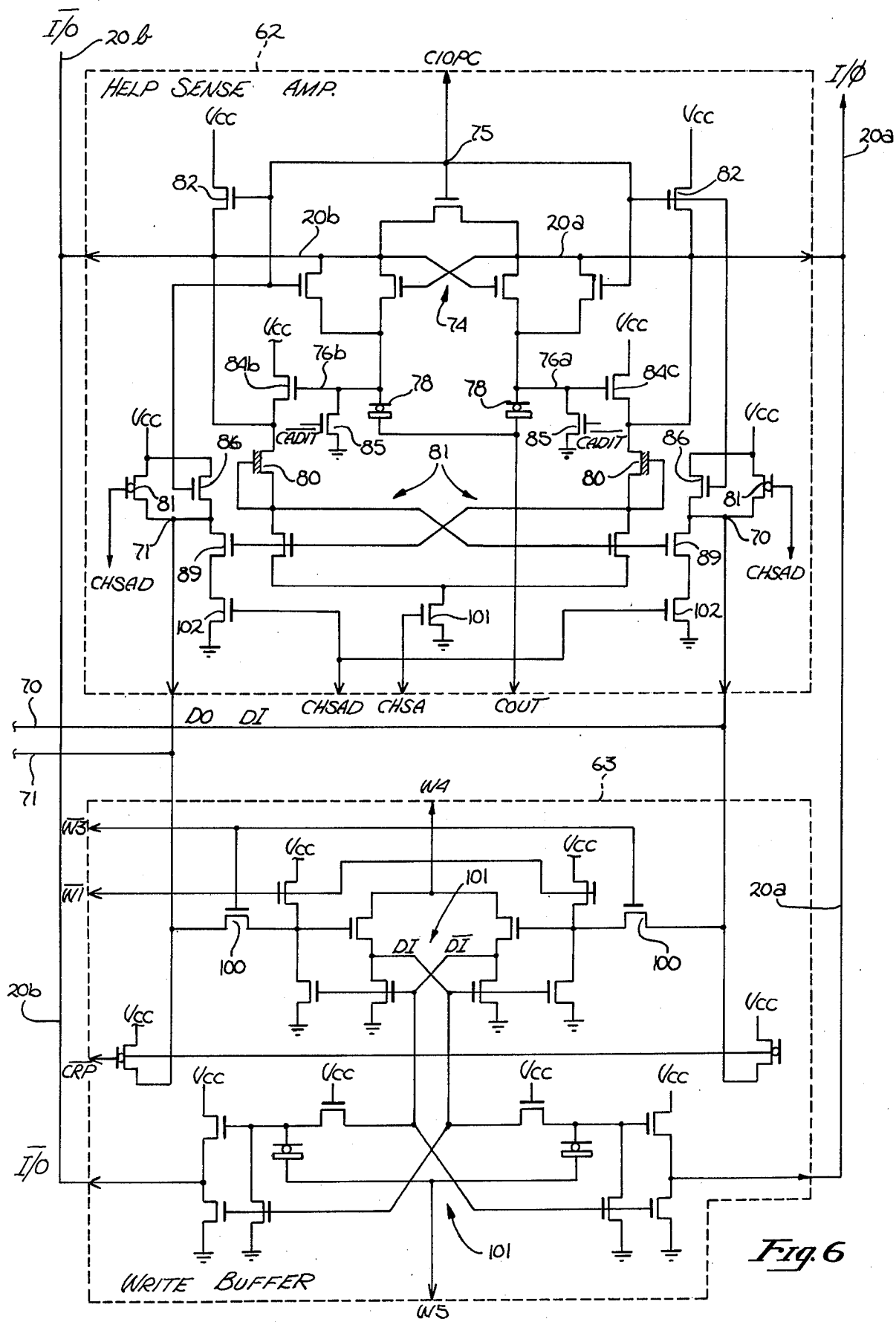
FIG. 6 is an electrical schematic of the help sense amplifier and write buffer of FIG. 5.
Figure 7:
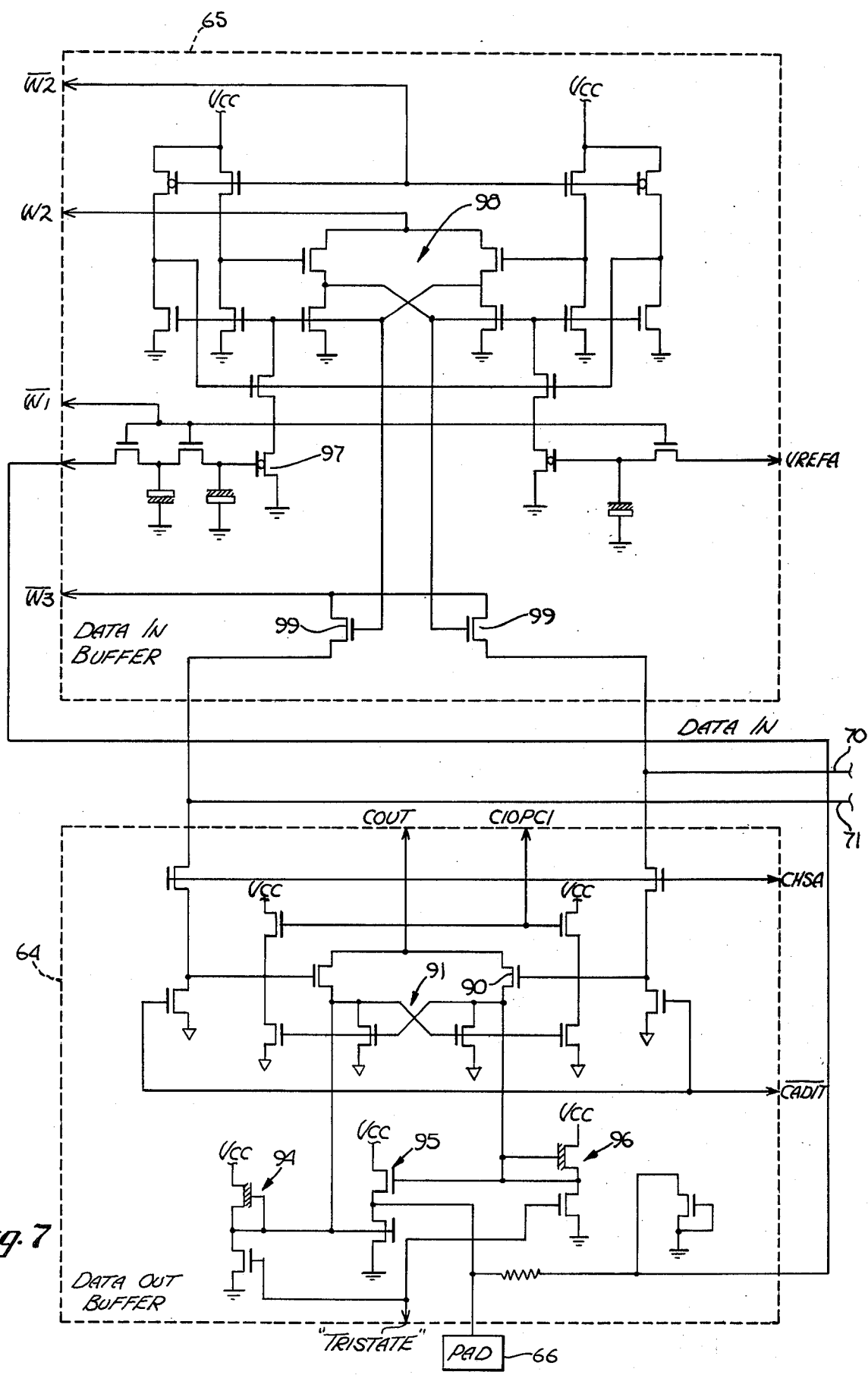
FIG. 7 is an electrical schematic of the data-in buffer and data-out buffer of FIG. 5.

(HSA 62 and write buffer 63 of FIG. 5 are shown in detail in FIG. 6; the data-in buffer 65 and data-out buffer 64 of FIG. 5 are shown in detail in FIG. 7.)

To some extent, the help sense amplifier 62 of FIG. 6 is of standard construction, however, it does include a unique restore feature which will be described later. In general, this amplifier helps the sensing process between the sense amplifier disposed between the bit line halves and the data-out buffer. This amplifier includes a first stage 74 which comprises a pair of cross-coupled field-effect transistors coupled to the bus lines 20a and 20b. These transistors generally operate in a linear region. The data signal on lines 20a and 20b is also coupled to a second stage 81 again comprising a pair of cross-coupled transistors. The input signal is coupled to the stage 81 through the depletion mode transistors 80 (transistors 84a and 84b operate somewhat as load devices for stage 81, however, the gates of these transistors are driven at nodes 76a and 76b by stage 74 particularly when the COUT signal goes high).

Referring to FIG. 3, the first waveform of FIG. 3 (AC/IO) illustrates typical waveforms on the bus 20. First, the column addresses are transmitted over this bus. The dotted line indicates a low address signal while the solid line a high address signal. Later in the cycle, typical potentials on the bus are illustrated for both an input/output line and the complementary line. The waveforms illustrate the reading of a binary one on the I/O line and its complement on the I/O/ line.

Initially, the CADIT/ signal is high, causing transistors 85 of FIG. 6 to conduct. This pulls nodes 76a and 76b to ground and discharges the capacitors 78. After this signal drops in potential, the CIOPC signal rises to 7.5 volts. This pulls node 75 of FIG. 6 to 7.5 volts causing transistors 82 to conduct. Both lines 20a and 20b are thus precharged to a full $V_{CC}$ potential. The signal on node 75 causes transistors 86 to conduct which precharges the data lines 70 and 71. Note at this point the CHSA signal is low, thus there is no conduction through stage 81 of the HSA.

As a sense amplifier reads data onto the bus lines 20a and 20b, an imbalance in charge occurs between the capacitors 78. When the CHSA signal goes high, the second stage 81 begins to conduct, then the CHSAD signal goes high, allowing lines 70 and 71 to be primarily controlled by the state of stage 81 through transistors 89, although some current is provided to these lines through the zero threshold transistors 81.

Finally, when COUT goes high, boosting the capacitors 78, stage 81 is set in one of its two stable states as determined by the signals on lines 20a and 20b. This causes one of the lines 70 and 71 to be set high and the other low.

Assume for sake of discussion that line 20a is high while line 20b is low. When stage 81 sets to its stable state, there is sufficient capacitive coupling to cause line 20a to momentarily dip in potential. This is particularly a problem during a late read. The momentary dropping of line 20a can upset the sense amplifier disposed between the bit lines halves. The transistors 84a and 84b provide a restoring current which prevents the high line from dropping in potential. For the described condition, node 76a will be high, while node 76b is low when stage 81 is set (COUT high). The potential on node 76a causes transistor 84a to conduct, assuring that line 28 does not drop in potential when the stage 81 becomes stable.

The data-out buffer 64 of FIG. 7 includes a cross-coupled stage or latch 91. This latch is set by the signals on the lines 70 and 71 when these signals are coupled to transistors 90 (when CHSA is high). First, however, the gates of transistors 90 are precharged when the CIOPC 1 signal is high. As the COUT signal rises, power is supplied to the transistors 90, allowing the latch to set. The state of the latch 91 drives the push-pull stages 94 and 96 which in turn drive the output stage 95. A TTL compatible signal is provided at pad 66.

The data-in buffer 65 is generally of ordinary design except for the "tristating" feature. It receives the input signal from pad 66 through the zero threshold voltage transistor 97. The input signal sets a latch 98 and drives the lines 70 and 71 to their appropriate state when the W3/ signal goes high which allows transistors 99 to conduct (The VREFA signal shown in FIG. 7 is the same reference potential used in sensing the address buffer inputs.).

During writing, the signals from the data-in buffer on lines 70 and 71 are communicated to write buffer 63 of FIG. 6 when the W3/ signal is high. This signal permits the signals to pass through transistors 100 and to then set the bistable circuit 101. This, in turn, drives the lines 20a and 20b through stage 101 of the write buffer when W4 and W5 go high. (The write buffer is of generally well-known construction except as set forth below.)

As mentioned above, during reading, it is necessary that the HSA 62 and data-out buffer 64 operate. However, it is important that the data-in buffer 65 and the write buffer 63 not interfere with the reading cycle. During reading, the write signals such as W2 and W3/ are not activated. This prevents power from being applied to the latch 98 of the data-in buffer of FIG. 7, and further prevents coupling of the lines 70 and 71 to the data-in buffer through transistors 99. The data-in buffer is effectively "tristated" internally and consequently is disabled from operating and interfering with the reading cycle. Similarly, since the W1/ and W3/ signals remain high and W4 and W5 remain low, the write buffer of FIG. 6 is effectively tristated and does not interfere with the reading cycle.

During a writing cycle, the write buffer 63 and data-in buffer 65 are required and the data-out buffer 64 help sense amplifier 62 are not used and moreover, must not interfere with writing. The CHSA signal and the CHASD signal remain low, disabling or tristating the help sense amplifier since transistors 101 and 102 do not conduct. Since the CHSA signal remains low, the data-out buffer of FIG. 7 is effectively decoupled from line 70 and 71 and therefore does not interfere with data being read into the memory.

Thus, by the unique selection and application of timing signals to the input and output buffers and related circuits multiplexing on certain internal memory buses is made possible.

POWER-ON RESET FEATURE

Dynamic RAMs typically include a plurality of timing signals generated within the memory. Some of these signals are discussed above (FIG. 3). When power is first applied to the memory, all of the timing generators may not begin to generate timing signals properly. Some nodes require precharging, and if the proper sequence of precharging and the application of other signals is not followed, the circuit may enter an incorrect state and remain in such state indefinitely (this state being frequently referred to as a "hang-up"). The invented memory includes a power-on reset circuit which detects the failure of one or more of the timing generators to provide a timing signal and then automatically resets the generators.

Figure 8:
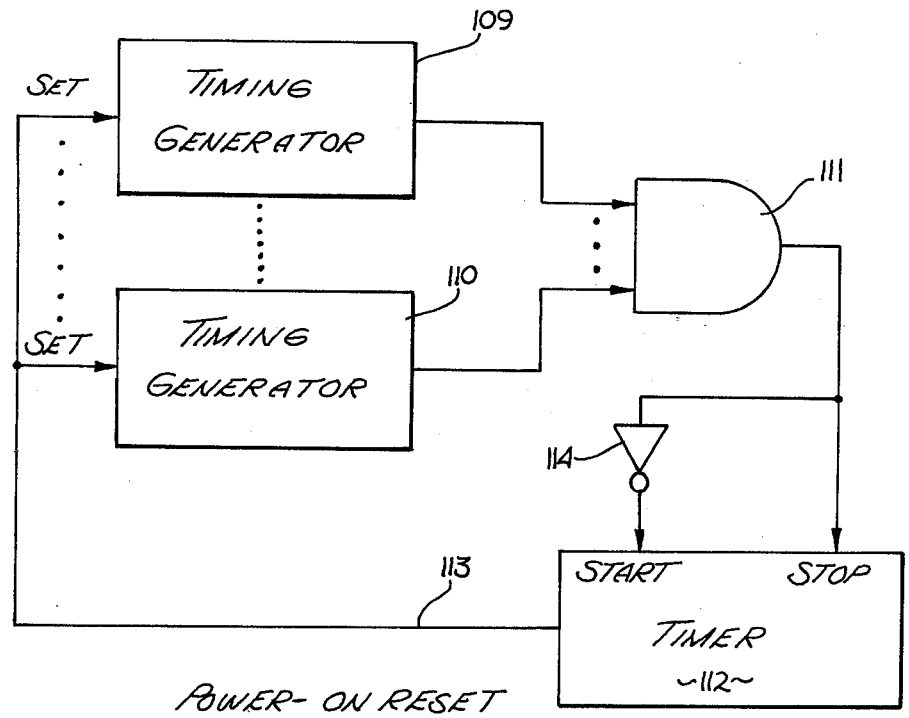
FIG. 8 is a block diagram describing the power on reset feature employed in the invented memory.
Figure 9:
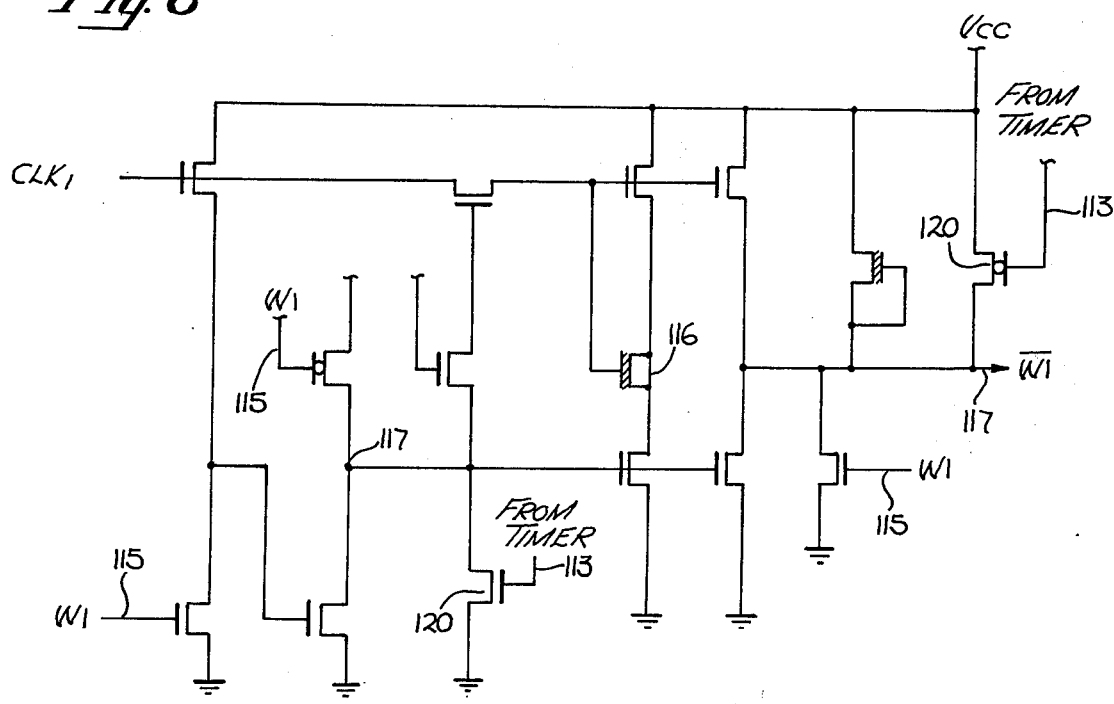
FIG. 9 is an electrical schematic of a timing generator and its circuitry for coupling with the block diagram of FIG. 8.

Referring to FIG. 8, the outputs of a plurality of the timing generators are coupled as inputs to an AND gate 111. Two timing generators 109 and 110, are illustrated in FIG. 8. The generators selected for the described embodiment have output signals which are high at the end of a read/write (or refresh) cycle. The W1/ signal is one such signal which can be used and its timing generator is shown in FIG. 9. It is not necessary to monitor all the timing signals since in many cases a timing signal is triggered by other timing signals, and thus the absence of these other timing signals is indirectly detected by gate 111. For instance, the W1/ generator of FIG. 9 requires the W1 signal and another input designated as $CLK_1$ as inputs. By way of example, the W1/ signal will not go high unless the W1 signal goes low. Consequently, monitoring the W1/ signal indirectly verifies the presence of the W1/ and $CLK_1$ signals.

If the outputs from all the generators coupled to the AND gate 111 are high, a high signal is applied to the stop terminal of a timer 112 and a low signal to the start terminal because of the inverter 114. The timer 112, in the presently preferred embodiment, is a 20 microsecond timer which provides an output on line 113 20 microseconds after receiving a start signal at its start terminal (output of gate 111, low) if a stop signal is not received during that period.

During a typical read/write cycle the conditions for gate 111 are not met, that is, the output of the gate is low starting the timer 112. At the end of the read/write cycle, if all the monitored generators are operating correctly, the inputs to gates 111 are all high and the timer 112 is stopped. This is the normal operating mode. However, if one or more of the generators are not operating correctly, the conditions for the gate 111 are not met and the 20 microsecond period runs without the timer being stopped. When this occurs, the signal on line 113 resets all of the generators to the correct states.

Referring to the timing generator of FIG. 9, the W1/ signal on line 117 goes high when the W1 signal on line 115 drops and after the $CLK_1$ signal goes high. The capacitor 116 provides a bootstrapped output in a well-known manner. The circuit of FIG. 9 can become "hung-up" if the $CLK_1$ signal is high when power is applied. In this event, node 117 will be pulled low, preventing the operation of the circuit. If this occurs, the signal on line 113 (from the timer of FIG. 8) causes transistors 120 to conduct and, in effect, resets the generator.

Thus, a dynamic random-access memory has been described which includes unique multiplexed buses which reduce substrate area and an automatic reset feature.

We claim:

1. In a random-access memory disposed on a substrate an improvement comprising:
   at least two spaced-apart groups of memory cells;
   a bus disposed between said spaced-apart groups of memory cells;
   first decoders for decoding first address signals such that first lines in said groups of cells are selected, said first decoders being disposed between said spaced-apart groups of memory cells;
   data lines coupled to cells in said groups of cells, said data lines extending toward said bus; and,
   multiplexing means for allowing said bus to first carry said first address signals to said first decoders and then to be coupled to said data lines,
   whereby said bus is used for both address signals and data signals, thereby reducing the area required for said memory.

2. The improvement defined by claim 1 wherein each of said groups of memory cells are divided into two spaced-apart arrays, and wherein second decoders for decoding second address signals are disposed between said spaced-apart arrays.

3. The improvement defined by claim 2 wherein said bus simultaneously receives a plurality of data signals.

4. The improvement defined by claim 3 wherein said first lines select bit lines in said arrays and said second lines are word lines in said array.

5. The improvement defined by claim 4 wherein said bus simultaneously receives two data bits and their complements from each of four of said arrays.

6. In a random-access memory disposed on a substrate an improvement comprising:
- at least a first pair of input/output lines disposed within said memory;
- a sense amplifier coupled to said first input/output lines for sensing data on said lines;
- a write buffer coupled to said first input/output lines for writing data into said memory through said lines;
- a memory input/output terminal;
- a data-in buffer coupled to said terminal;
- a data-out buffer coupled to said terminal;
- a second pair of input/output lines interconnecting said data-in and data-out buffers with said sense amplifier and said write buffer;
- multiplexing means for enabling said sense amplifier and data-out buffer and disabling said data-in buffer and write buffer when data is read out of said memory, and for enabling said write buffer and data-in buffer and disabling said data-out buffer and sense amplifier when data is read out of said memory;
- whereby data is read into and out of said memory from said terminal via said first and second pair of input/output lines.

7. The improvement defined by claim 6 wherein said first and second pairs of input/output lines carry true data signals and their complements.

8. The improvement defined by claim 7 including second multiplexing means for allowing said first input/output lines to selectively carry address signals and said data signals.

9. The improvement defined by claim 7 wherein said first input/output lines are selectively coupled to bit lines in said memory.

10. The improvement defined by claim 9 wherein said sense amplifier includes a first stage comprising a first pair of cross-coupled, field-effect transistors with their gates coupled to said first input/output lines and a second stage coupled to said first input/output lines and said first stage, said second stage comprising a second pair of cross-coupled, field-effect transistors.

11. The improvement defined by claim 10 including a restoring circuit coupled to said first input/output lines for assuring that the one of said lines which is high during reading remains high when said second stage of said sense amplifier assumes a stable state.

12. The improvement defined by claim 11 wherein said restoring circuit comprises a third pair of field-effect transistors driven by said first step and coupled to selectively provide a path of current to one of said first input/output lines.

13. In a dynamic random-access memory disposed on a substrate which includes a plurality of timing generators on said substrate for generating timing signals for said memory, an improvement comprising:
- first circuit means coupled to said generators for determining if said generators are generating timing signals;
- second circuit means coupled to said first circuit means and said generators for resetting said generators if said first circuit means determines that said generators are not generating timing signals;
- whereby an automatic power-on reset feature is realized for said memory.

14. The improvement defined by claim 13 wherein said first circuit means comprise a logic gate and the second circuit means a timer.

15. The improvement defined by claim 14 wherein a signal from said logic gate starts and stops said timer.

* * * * *